United States Patent
Son

(10) Patent No.: US 9,136,466 B2
(45) Date of Patent: Sep. 15, 2015

(54) PHASE-CHANGE RANDOM ACCESS MEMORY DEVICE AND METHOD OF MANUFACTURING THE SAME

(75) Inventor: Min Seok Son, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 279 days.

(21) Appl. No.: 13/339,818

(22) Filed: Dec. 29, 2011

(65) Prior Publication Data

US 2012/0286228 A1    Nov. 15, 2012

(30) Foreign Application Priority Data

May 11, 2011    (KR) .................. 10-2011-0043891

(51) Int. Cl.
 *H01L 27/24*  (2006.01)
 *H01L 45/00*  (2006.01)

(52) U.S. Cl.
 CPC ............ *H01L 45/06* (2013.01); *H01L 45/1233* (2013.01); *H01L 45/1253* (2013.01); *H01L 45/1675* (2013.01)

(58) Field of Classification Search
 CPC ............................... H01L 27/24; H01L 45/04
 USPC ................................................................. 257/4
 See application file for complete search history.

(56) References Cited

U.S. PATENT DOCUMENTS

| | | | |
|---|---|---|---|
| 2004/0202033 A1* | 10/2004 | Lowrey | 365/200 |
| 2004/0248339 A1* | 12/2004 | Lung | 438/102 |
| 2007/0164266 A1* | 7/2007 | Choi | 257/4 |

FOREIGN PATENT DOCUMENTS

| | | |
|---|---|---|
| KR | 1020110012383 | 2/2011 |
| KR | 1020110035784 | 4/2011 |

\* cited by examiner

*Primary Examiner* — Matthew Reames
(74) *Attorney, Agent, or Firm* — IP & T Group LLP

(57) ABSTRACT

A phase change random access memory device includes a bottom electrode contact formed within a bottom electrode contact hole, a phase-change material pattern formed to surround a side of an upper portion of the bottom electrode contact, and an insulating layer buried within the phase-change material pattern and formed on an upper surface of the bottom electrode contact.

6 Claims, 4 Drawing Sheets

PHASE-CHANGE RANDOM ACCESS MEMORY DEVICE AND METHOD OF MANUFACTURING THE SAME

CROSS-REFERENCES TO RELATED APPLICATION

The present application claims priority under 35 U.S.C. 119(a) to Korean application number 10-2011-0043891, filed on May 11, 2011, in the Korean Patent Office, which is incorporated by reference in its entirety as if set forth herein in full.

BACKGROUND

1. Technical Field

Exemplary embodiments of the present invention relate to a semiconductor device, and more particularly, to a phase-change random access memory device and a method of manufacturing the same.

2. Related Art

Phase-change random access memory (PCRAM) devices have a simple structure, realize high integration with a low cost, and perform high speed operation.

As well known, the PCRAM devices are a current driving type of memory device in which data is stored by changing a crystalline state of a phase-change material layer by a heating electrode, that is, a heater.

In the PCRAM devices, control of a set current for transition of the phase-change material layer to a crystalline state and control of a reset current for transition of the phase-change material layer to an amorphous state serve as essential factors for determining performance of the PCRAM devices.

In particular, a bottom electrode contact which is the heating electrode has been changed in various types to reduce the reset current. An example thereof will be described with reference to FIG. 1.

FIG. 1 is a cross-sectional view illustrating a structure of a conventional PCRAM device, which is taken along a bit line direction of the PCRAM device.

Referring to FIG. 1, a switching device 12 is formed on a semiconductor substrate 10 and a bottom electrode contact 14 electrically connected to the switching device 12 is formed on the switching device 12. A phase-change material layer 16 is formed on the bottom electrode contact 14.

In particular, the bottom electrode contact 14 may be formed in a line type to minimize a contact area with the phase-change material layer thereon.

In FIG. 1, for example, the phase-change material layer 16 is described as a partially confined structure. Thus, the phase-change material layer 16 having the partially confined structure allows a thermal effect between adjacent cells to be minimized.

However, the existing PCRAM device is fabricated without separation between the phase-change material layers 16 in the bit line direction as shown in FIG. 1. Therefore, when a distance between the adjacent cells is not significantly ensured, a distance between phase transition regions 18 is reduced in a cell operation. Therefore, the cells of the PCRAM may be vulnerable to disturbance therebetween. With high integration of the cells, the distance between the adjacent cells becomes more reduced so that the cells may malfunction due to the disturbance therebetween.

SUMMARY

According to one aspect of an exemplary embodiment, a phase-change random access memory (PCRAM) device is provided. The PCRAM device includes a bottom electrode contact formed within a bottom electrode contact hole, a phase-change material pattern formed to surround a side of an upper portion of the bottom electrode contact, and an insulating layer buried within the phase-change material pattern and formed on an upper surface of the bottom electrode contact.

According to another aspect of an exemplary embodiment, a method of manufacturing a PCRAM device is provided. The method includes forming an interlayer insulating layer on a semiconductor substrate and patterning the interlayer insulating layer to form a bottom electrode contact hole, forming a bottom electrode contact within the bottom electrode contact hole, removing the interlayer insulating layer by a set depth to expose an upper portion of the bottom electrode contact, forming a phase-change material layer on an entire structure of the semiconductor substrate, and forming a phase-change material pattern surrounding a side of the upper portion of the bottom electrode contact and exposing an upper surface of the bottom electrode contact by patterning the phase-change material layer.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
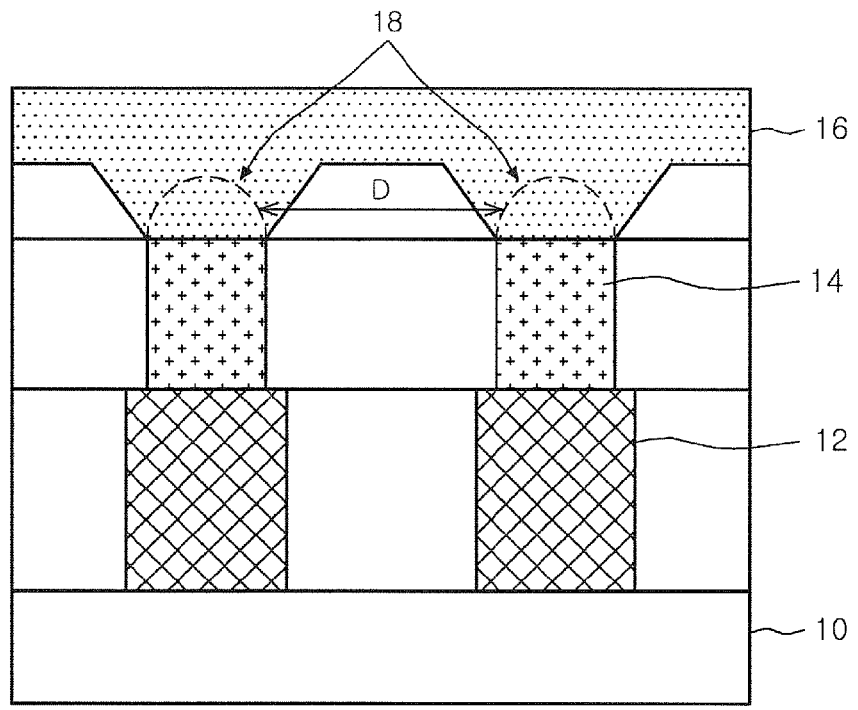
FIG. 1 is a cross-sectional view illustrating a structure of a conventional phase-change random access memory (PCRAM) device.

Hereinafter, exemplary embodiments will be described in greater detail with reference to the accompanying drawings.

Exemplary embodiments are described herein with reference to cross-sectional views of exemplary embodiments (and intermediate structures). However, proportions and shapes illustrated in the drawings are exemplary only and may vary depending on various manufacturing techniques and/or design considerations. In parts of the drawings, lengths and sizes of layers and regions of exemplary embodiments may be exaggerated for clarity in illustration. Throughout the drawings, like reference numerals denote like elements. Throughout the disclosure, when a layer is referred to as being "on" another layer or substrate, it can be directly on the other layer or substrate, or intervening layers may also be present.

FIGS. 2 to 5 are cross-sectional views illustrating a method of manufacturing a phase-change random access memory (PCRAM) device according to an exemplary embodiment of the present invention.

Figure 2:
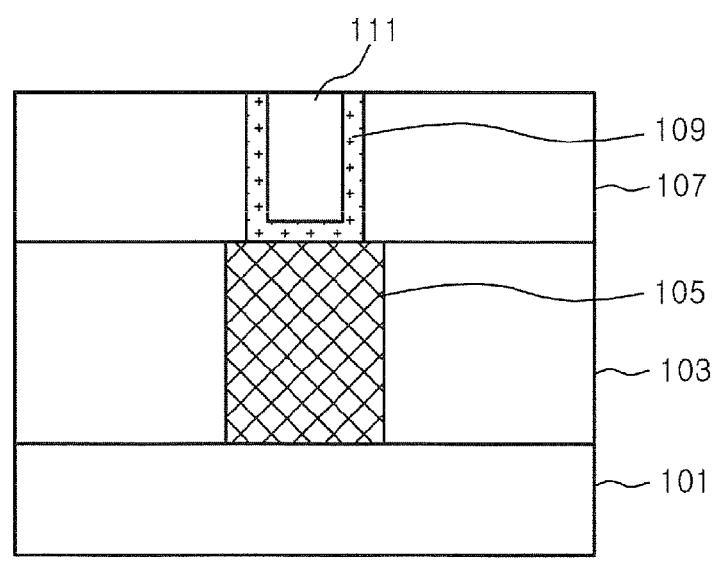
FIGS. 2 to 5 are cross-sectional views illustrating a method of manufacturing a PCRAM device according to an exemplary embodiment of the present invention.

Referring to FIG. 2, a switching device 105 and a bottom electrode contact 109 are formed on a semiconductor substrate 101 in which a lower structure is formed.

More specifically, the switching device 105 is formed on the semiconductor substrate 101 on which a wiring layer such as a word line, and the like is formed. The reference numeral 103 denotes a first interlayer insulating layer.

The bottom electrode contact 109 electrically connected to the switching device 105 is formed on the switching device 105. An outer circumference of the bottom electrode contact 109 is buried in a second interlayer insulating layer 107 to make a cell separation and an insulating layer 111 is buried within the bottom electrode contact 109. That is, in the exemplary embodiment, the bottom electrode contact 109 may be formed in a ring type.

Figure 3:
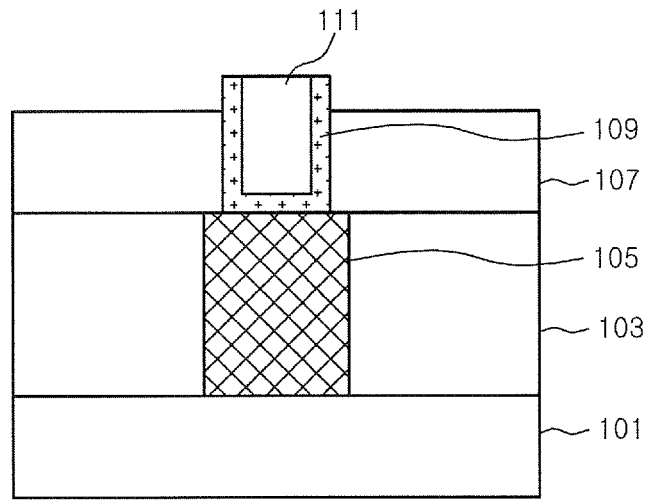

Subsequently, as shown in FIG. 3, the second interlayer insulating layer 107 in the outer circumference of the bottom electrode contact 109 is removed by a set depth to expose the bottom electrode contact 109 of a set height.

Figure 4:
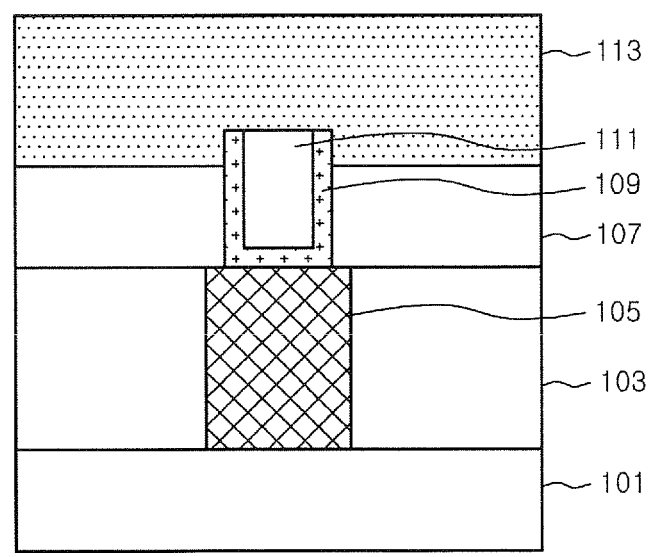

As shown in FIG. 4, a phase-change material layer 113 is formed on an entire structure of the semiconductor substrate 101. Therefore, the phase-change material layer 113 is formed to cover the outer circumference and an upper surface of the bottom electrode contact 109.

Figure 5:
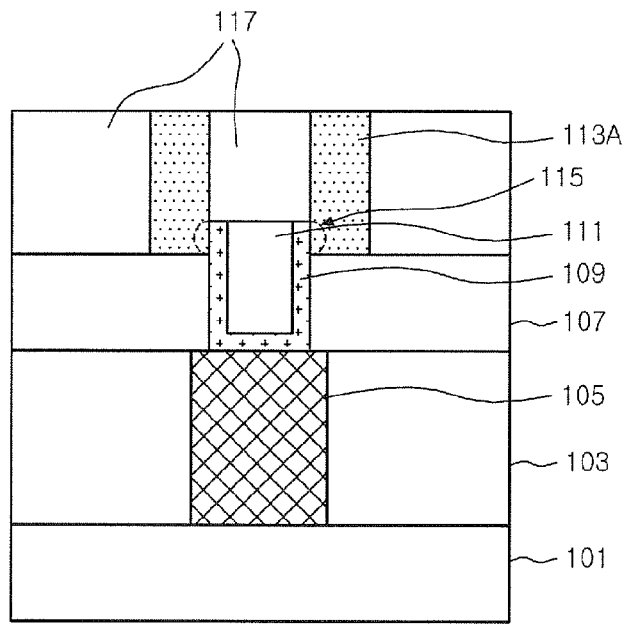

As shown in FIG. 5, the phase-change material layer 113 is patterned to form a phase-change material pattern 113A. The phase-change material pattern 113A is in contact with only the outer circumference of the bottom electrode contact 109. Subsequently, an insulating layer 117 may be filled within the phase-change material pattern 113A. In addition, the phase-change material layer 113 is patterned in a word line direction and a bit line direction so that the outer circumference of the phase-change material pattern 113A may be surrounded by the insulating layer 117. In this case, disturbance may be prevented from occurring between cells in the word line direction and the bit line direction effectively.

FIGS. 4 and 5 illustrates that the phase-change material layer 113 is formed and then patterned, but the exemplary embodiment is not limited thereto. That is, in FIG. 4, the phase-change material layer 113 and a conductive layer for a top electrode may be sequentially formed and patterned so that the phase-change material layer 113 is in contact with the outer side of the bottom electrode contact 109 by a set height and an upper surface of the bottom electrode contact 109 is exposed.

When a reset current or a set current is applied through the switching device 105, heat is transferred to the phase-change material pattern 113A through the bottom electrode contact 109. In the exemplary embodiment of the present invention, since only outer circumference of the bottom electrode contact 109 is in contact with the phase-change material pattern 113A and the insulating layer is buried within the bottom electrode contact 109, phase transition occurs only in the outer circumference of the bottom electrode contact 109.

A size (caliber or diameter) of the bottom electrode contact 109 is controlled to be smaller to reduce a contact area with the phase-change material pattern 113A. Therefore, when the phase transition does not occur in an upper portion of the bottom electrode contact 109, but in an outer side portion, a distance between phase transition regions 115 may be significantly ensured with respect to an adjacent cell, thereby minimizing a disturbance effect between adjacent cells.

Although not shown, after the phase-change material pattern 113A and the top electrode are formed, a bit line may be formed. When the bit line is patterned to make separation between cells, an effect due to the disturbance between the adjacent cells may be more reduced.

In FIGS. 2 to 5, for example, the bottom electrode contact 109 is described as a ring type, but the exemplary embodiment is not limited thereto. Various types of bottom electrode contacts are described below.

Figure 6:
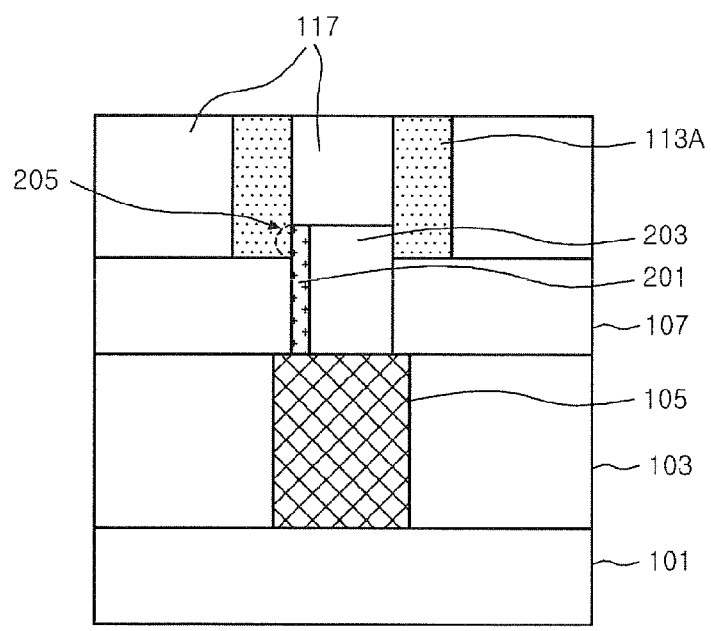
FIG. 6 is a cross-sectional view illustrating a PCRAM device according to another exemplary embodiment of the present invention.

FIG. 6 is a cross-sectional view of the PCRAM device according to another exemplary embodiment of the present invention.

Referring to FIG. 6, in the PCRAM device according to the exemplary embodiment, a bottom electrode contact 201 is formed on only part of the lateral surface of a bottom electrode contact hole and an insulating layer is buried within a remaining portion of the bottom electrode contact hole.

The bottom electrode contact hole may have a hollow cylindrical type or a hollow tetragonal pillar type according to a formation method thereof. Regardless of the type of the bottom electrode contact hole, the bottom electrode contact 201 as shown in FIG. 6 may be formed by forming a conductive layer for a bottom electrode on an entire structure of a semiconductor substrate in which the bottom electrode contact hole is formed and patterning the conductive layer to remain in only part of the bottom electrode contact hole.

In this case, the bottom electrode contact 201 is in contact with the phase-change material pattern 113A in one outer lateral surface and the phase-change material pattern 113A is in contact with the insulating layer 203 in the other outer lateral surface of the bottom electrode contact hole.

As a result, the phase transition occurs in a part of the outer lateral surface of the bottom electrode contact hole and a distance between the phase transition regions 205 for adjacent cells may be significantly ensured.

Figure 7:
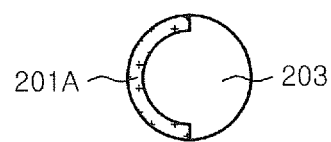
FIG. 7 is an illustrative view of a bottom electrode contact of FIG. 6.
Figure 8:
FIG. 8 is another illustrative view of a bottom electrode contact of FIG. 6.
Figure 9:
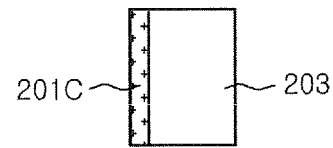
FIG. 9 is still another illustrative view of a bottom electrode contact of FIG. 6.

FIGS. 7 to 9 are illustrative views of the bottom electrode contact as shown in FIG. 6.

First, FIG. 7 illustrates that a bottom electrode contact hole is formed in a hollow cylindrical type and a bottom electrode contact 201A is formed in a portion of an inner circumference of the bottom electrode contact hole. A remaining region of the bottom electrode contact hole other than a region in which the bottom electrode contact 201A is formed is filled with an insulating layer 203.

FIG. 8 illustrates that the bottom electrode contact hole is formed in a hollow rectangular pillar type and FIG. 9 illustrates that the bottom electrode contact hole is formed in a hollow square pillar type.

Referring to FIGS. 8 and 9, a conductive layer for a bottom electrode is formed in one side of the inside of a bottom electrode contact hole having a hollow tetragonal pillar to form a bottom electrode contact 201B or 201C and an insulating layer 203 is buried within the remaining bottom electrode contact hole.

In any case, the bottom electrode contact 201A, 201B, or 201C is formed in one side of the inside of the bottom electrode contact hole, the insulating layer 203 is buried within the remaining bottom electrode contact hole, and the phase-change material pattern 113A is in contact with the bottom electrode contact 201A, 201B, or 201C in the outer side of the bottom electrode contact 201A, 201B, or 201C. Therefore, the distance between the phase transition regions may be significantly ensured.

Even in the exemplary embodiment, a bit line may be formed after the phase-change material pattern 113A and a top electrode (not shown) are formed. The bit line may be patterned to separate the cells. By the patterning of the bit line, an effect of disturbance between the cells may be more reduced and operation reliability of the PCRAM device may be increased.

While certain embodiments have been described above, it will be understood that the embodiments described are by way of example only. Accordingly, the present invention should not be limited to the specific disclosed embodiments, and claims should be broadly interpreted to include all reasonably suitable embodiments consistent with the exemplary embodiments.

What is claimed is:

1. A phase-change random access memory (PCRAM) device, comprising:
    an insulating layer formed surrounding an outer surface of a bottom electrode contact hole;
    a bottom electrode contact formed within the bottom electrode contact hole and having a projecting portion projected higher than an upper surface of the insulating layer;
    a phase-change material pattern formed surrounding the whole outer surface of the projecting portion of the bottom electrode contact; and
    an insulating layer buried within the phase-change material pattern and formed over the upper surface of the bottom electrode contact.

2. The PCRAM device of claim 1, wherein the phase-change material pattern is formed in a ring type.

3. The PCRAM device of claim 2, further comprising an interlayer insulating layer formed surrounding an outer circumference of the phase-change material pattern.

4. The PCRAM device of claim 1, wherein the bottom electrode contact hole has a hollow cylindrical shape and the bottom electrode contact includes a conductive layer formed over a bottom and a sidewall of the bottom electrode contact hole.

5. The PCRAM device of claim 1, wherein the bottom electrode contact hole has a hollow cylindrical shape and the bottom electrode contact includes a conductive layer formed over a part of a sidewall of the bottom electrode contact hole.

6. The PCRAM device of claim 1, wherein the bottom electrode contact hole has a hollow tetragonal pillar shape and the bottom electrode contact includes a conductive layer formed over one sidewall of the bottom electrode contact hole.

* * * * *